United States Patent
Fong et al.

(10) Patent No.: US 11,397,455 B2
(45) Date of Patent: Jul. 26, 2022

(54) MANAGING DC POWER

(71) Applicant: Microsoft Technology Licensing, LLC, Redmond, WA (US)

(72) Inventors: Chee Kiong Fong, Saratoga, CA (US); Geoffrey Jason Shew, Redmond, WA (US); Gary Alan Tornquist, Sammamish, WA (US); Edward C. Giaimo, III, Bellevue, WA (US); Richard F. Johnson, Redmond, WA (US); Tim R. Calland, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 42 days.

(21) Appl. No.: 16/127,040

(22) Filed: Sep. 10, 2018

(65) Prior Publication Data
US 2020/0081510 A1 Mar. 12, 2020

(51) Int. Cl.
*G06F 1/28* (2006.01)
*G01R 31/69* (2020.01)
(Continued)

(52) U.S. Cl.
CPC ............. *G06F 1/28* (2013.01); *G01R 31/69* (2020.01); *G05F 3/08* (2013.01); *G06F 11/3062* (2013.01); *G01R 31/40* (2013.01)

(58) Field of Classification Search
CPC ........... G01R 31/69; G01R 31/40; G05F 3/08; G06F 1/28; G06F 11/3062
See application file for complete search history.

(56) References Cited

U.S. PATENT DOCUMENTS 5,138,513 A 8/1992 Weinstein
6,320,766 B1 11/2001 Park
(Continued)

FOREIGN PATENT DOCUMENTS

CN 104043194 A 9/2014
EP 1885124 A2 2/2008

OTHER PUBLICATIONS

Variable Voltage Power Supply from Fixed Voltage Regulator, Apr. 19, 2018, Electronics Hub, [https://www.electronicshub.org/variable-voltage-power-supply-from-fixed-voltage-regulator/] (Year: 2018).*
(Continued)

*Primary Examiner* — Jaweed A Abbaszadeh
*Assistant Examiner* — Hyun Soo Kim
(74) *Attorney, Agent, or Firm* — Alleman Hall Creasman & Tuttle LLP

(57) ABSTRACT

Examples are disclosed that relate to power supply devices and methods for managing DC power. In one example, a method comprises: providing DC power at a first voltage until determining that a standby time period has elapsed; determining that a load is connected to the power supply device; and based on determining that the standby time period has elapsed, entering a restricted power mode, wherein the restricted power mode comprises either: deactivating the DC power, or (1) providing the DC power at a second voltage until determining that a load detection time period has elapsed, (2) deactivating the DC power after determining that the load detection time period has elapsed, and (3) repeating (1) and (2) until determining that the load is no longer connected to the power supply device.

20 Claims, 8 Drawing Sheets

(51) Int. Cl.
*G05F 3/08* (2006.01)
*G06F 11/30* (2006.01)
*G01R 31/40* (2020.01)

(56) References Cited

U.S. PATENT DOCUMENTS

| | | | |
|---|---|---|---|
| 6,460,168 B1 | 10/2002 | Yamamoto et al. | |
| 7,016,794 B2 | 3/2006 | Schultz | |
| 7,034,513 B2 | 4/2006 | Gan et al. | |
| 7,400,480 B2 | 7/2008 | Huang et al. | |
| 7,533,193 B2 | 5/2009 | Testin et al. | |
| 7,719,302 B2 | 5/2010 | Hsu et al. | |
| 7,911,817 B2 * | 3/2011 | Kasprzak | H02M 3/335 363/146 |
| 8,159,839 B2 | 4/2012 | Matthews | |
| 8,164,932 B2 * | 4/2012 | Sims | H02M 7/02 363/69 |
| 8,476,765 B2 | 7/2013 | Zhang et al. | |
| 9,054,584 B2 | 6/2015 | Haight et al. | |
| 9,444,345 B2 * | 9/2016 | Marchand | H02M 1/36 |
| 9,753,076 B2 | 9/2017 | Cadigan et al. | |
| 9,843,212 B2 | 12/2017 | Telefus | |
| 10,191,535 B2 * | 1/2019 | Sun | G06F 1/3296 |
| 2005/0231042 A1 * | 10/2005 | Kephart | H02J 7/0032 307/141 |
| 2007/0250722 A1 * | 10/2007 | Montero | G06F 1/263 713/300 |
| 2009/0108828 A1 * | 4/2009 | Edamula | H02J 1/06 323/318 |
| 2010/0011234 A1 * | 1/2010 | Malik | G06F 1/26 713/323 |
| 2010/0067268 A1 * | 3/2010 | Kasprzak | H02M 3/335 363/74 |
| 2011/0286250 A1 * | 11/2011 | Wang | H02M 1/00 363/125 |
| 2013/0241509 A1 | 9/2013 | Chung et al. | |
| 2015/0163113 A1 * | 6/2015 | Yoshida | H04L 43/0829 370/252 |
| 2015/0346792 A1 * | 12/2015 | Rathi | G05F 1/625 713/310 |
| 2018/0284047 A1 * | 10/2018 | Kim | H01R 13/5202 |
| 2018/0294679 A1 * | 10/2018 | Nakano | B60L 11/1846 |

OTHER PUBLICATIONS

Nadgouda, Rahul, "Electromigration Analysis of Signal Nets", In Thesis of Linkoping University, Nov. 4, 2014, 87 Pages.

"International Search Report and Written Opinion Issued In PCT Application No. PCT/US19/038845", dated Oct. 28, 2019, 12 Pages.

* cited by examiner

MANAGING DC POWER

BACKGROUND

Some electronic devices, such as laptops, tablets, mobile phones, and other computing devices, utilize low voltage direct current (DC) power supplies coupled to a device with connectors that facilitate simple removal. Some such connectors have exposed contacts. Electromigration may occur when the contacts touch another object.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed that relate to power supply devices and methods for managing DC power. In one example, a method comprises: providing DC power at a first voltage until determining that a standby time period has elapsed; determining that a load is connected to a power supply device; and based on determining that the standby time period has elapsed, entering a restricted power mode. In the restricted power mode, the method comprises either deactivating the DC power, or (1) providing the DC power at a second voltage until determining that a load detection time period has elapsed. After determining that the load detection time period has elapsed, the method comprises (2) deactivating the DC power, and (3) repeating (1) and (2) until determining that the load is no longer connected to the power supply device.

DETAILED DESCRIPTION

Some electronic devices, such as laptops, tablets, mobile phones, and other computing devices, utilize low voltage direct current (DC) power supplies. Such power supplies may be coupled to a device with connectors that facilitate simple removal. For example, a power supply for a computing device may utilize a male/female connector that may allow a user to easily plug in or unplug the power supply from the computing device.

Some such power supply devices may have exposed pins or other contacts that form a circuit when touching corresponding pins or contacts of another device. In a similar manner, a circuit may be formed when the exposed pins/contacts touch another conductive object, such as a metal surface or a person's skin. In these situations, electromigration may occur when current flows through the object in contact with the positively-charged power pin and the negatively-charged ground pin of the power supply. As the current flows through the object, metallic material from the positively-charged pin or negatively-charged pin may transfer to the object. In some examples, the material may remain embedded on or within the object. In some examples, during metallic material migration, the metallic material may form dendrites on the negatively-charged pin that grow within the object toward the positive pin, or vice versa, which may damage the object and/or the power supply pins.

To reduce the effects of supplying high current to a faulty load, some power supply devices output lower voltages or limit the current to the output until a signal is received from a device connected to the power supply. However, even at lower voltages or current, electromigration may still occur when the contacts touch another object for a sufficiently long time period.

Figure 1:
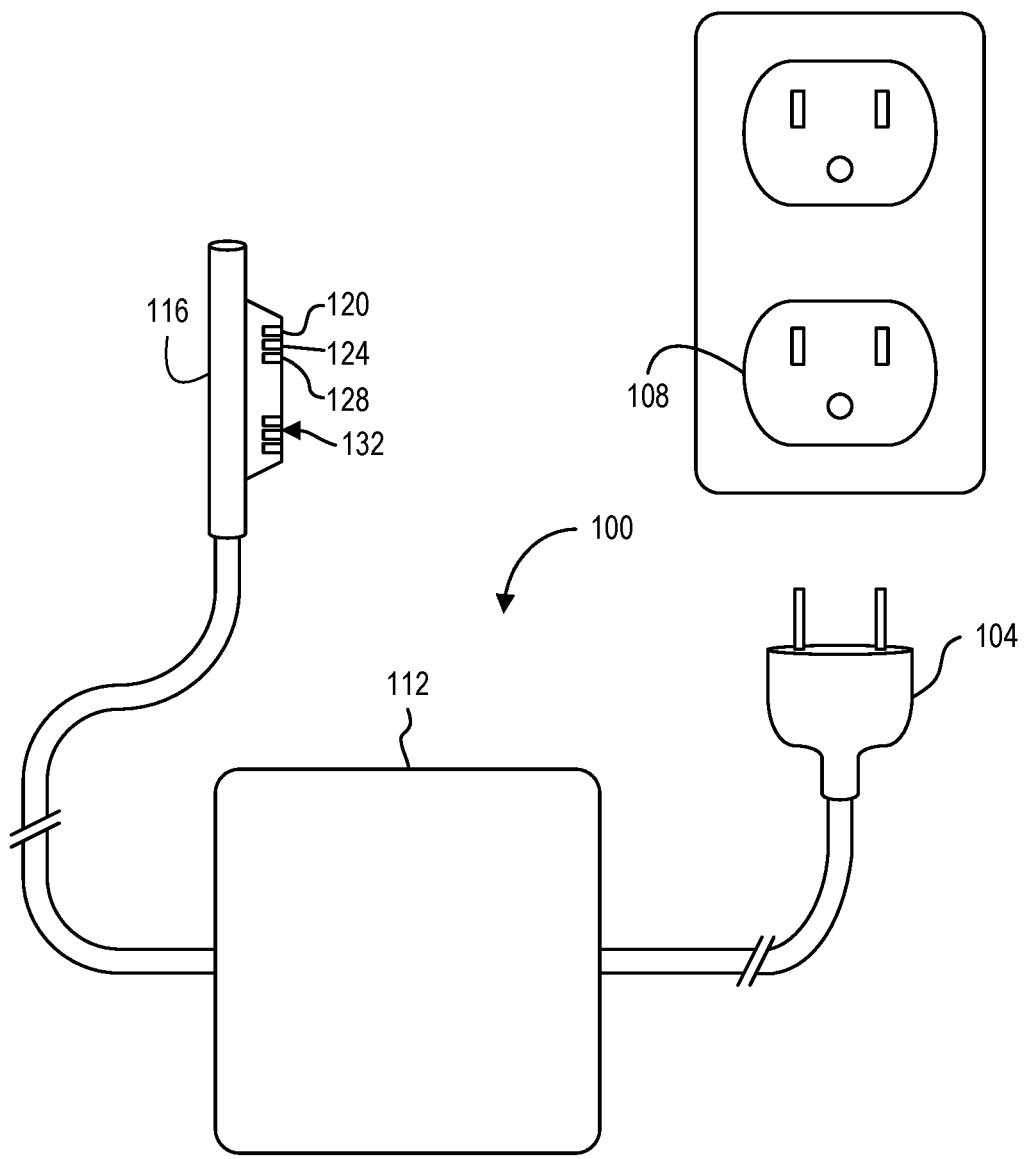
FIG. 1 shows an example of a power supply device according to examples of the present disclosure.

Accordingly, examples are disclosed that relate to power supply devices and methods for managing DC power. With reference now to FIG. 1, in one example, a power supply device 100 may have a first connector 104 configured to plug into an electrical receptacle 108. The power supply device 100 may comprise one or more electrical components configured to transform electrical power supplied via the receptacle 108, such as 120V alternating current (AC), into low-voltage DC. In the example illustrated in FIG. 1, the power supply device 100 may encase such electrical components in a housing 112. In other examples, the power supply device may integrate the electrical components with the first connector 104 or other components. Additional details regarding the electrical components and other features of power supply device 100 are provided below with respect to FIG. 2.

As illustrated in FIG. 1, the power supply device 100 may also have a second connector 116 which may be configured to supply the low-voltage DC power to another device, such as via insertion into a mating slot in the other device. The second connector 116 may have one or more contacts, including a power contact 120, a signal contact 124 and a ground contact 128. Additional power contacts, signal contacts, and ground contacts may also be provided on the second connector 116, as illustrated on a bottom portion 132 of the second connector 116 illustrated in FIG. 1. The additional power contacts, signal contacts, and ground contacts may be arranged symmetrically, such that the second connector 116 may be plugged into a device in a variety of orientations without impacting a polarity of the circuit. It will be appreciated that the illustrated configuration of contacts is provided by way of example, and that these contacts, the second connector 116 and the housing 112 of power supply device 100 may have any other suitable form or configuration.

Each of the one or more power contacts may comprise a positively-charged terminal and each of the one or more ground contacts may comprise a negatively-charged terminal. As illustrated in FIG. 1, the power contact 120 and the ground contact 128 are exposed when the second connector 116 is not plugged into another device. As described above, in some cases other objects may touch the second connector 116 and form a circuit with the power contact 120 and the ground contact 128. Over prolonged periods of time period, electromigration may occur that may damage the object and/or one or more of the power contact 120 and the ground contact 128.

To address such situations, and in one potential advantage of the present disclosure, power supply 100 may be configured to provide discrete pulses of power to the power contact 120 in a manner that reduces the power output in case there is a faulty load. As described in more detail below, in some examples the power supply 100 may utilize a restricted power mode. In the restricted power mode of the present disclosure, the current through other objects touching the contacts may be eliminated or reduced. In this manner, the effects of electromigration may be reduced or substantially eliminated, regardless of the duration of contact with the other object.

Figure 2:
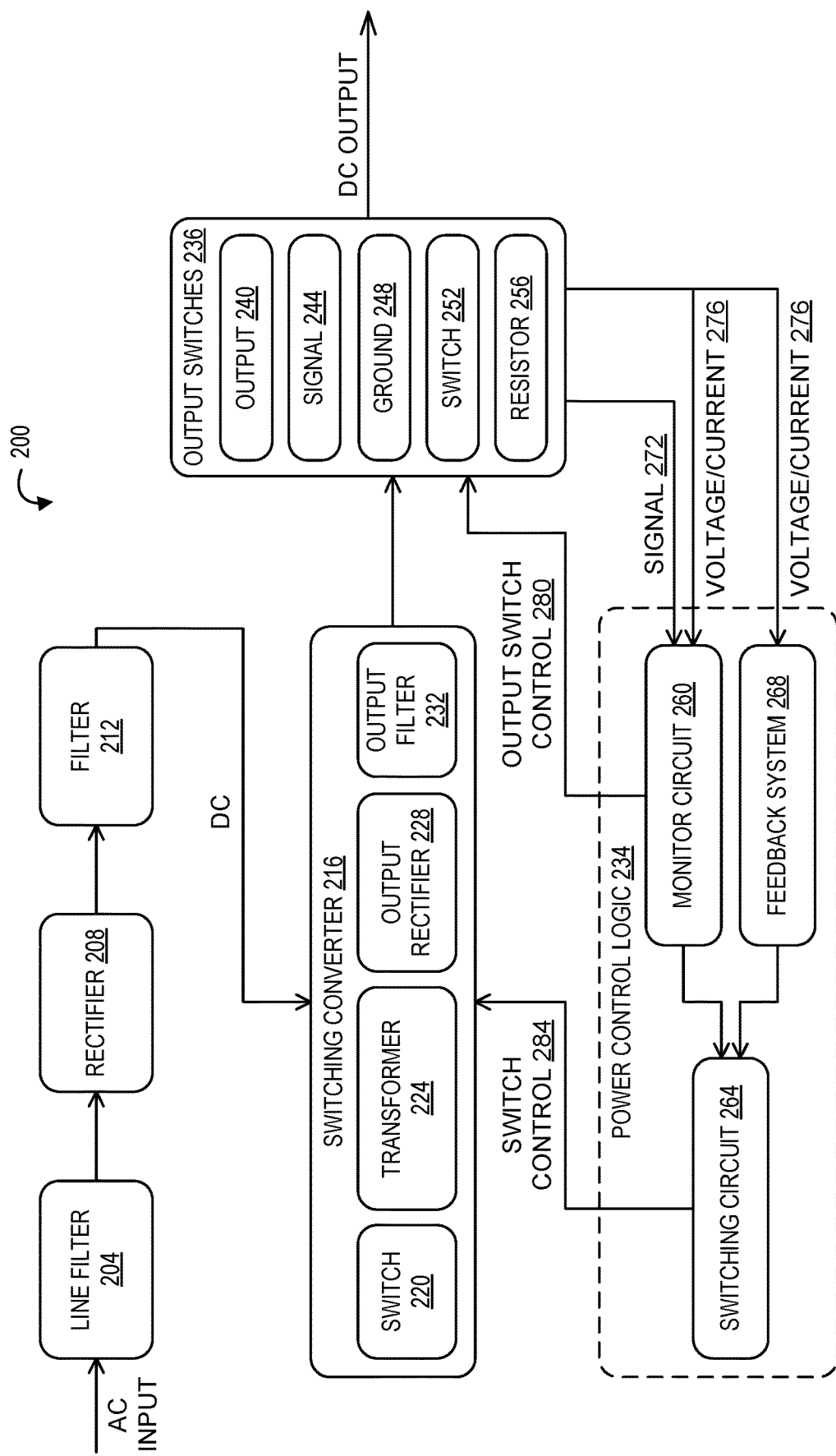
FIG. 2 shows a block diagram illustrating an example system for managing DC power according to examples of the present disclosure.

With reference now to FIG. 2, an example power supply system 200 is illustrated for managing DC power. The power supply system 200 may take various forms. For example, the power supply system 200 may comprise one or more electrical components that may be integrated within the power supply device 100 of FIG. 1, or other suitable devices.

As illustrated in FIG. 2, the power supply system 200 may receive AC power via a line filter 204. From the line filter 204, a rectifier 208 may receive the AC power to begin converting the AC power to DC. For example, 120V AC may be converted into about 340V to 400V DC, which may vary depending on a bridge diode arrangement and/or a Power Factor Correction circuit. The power may be filtered again via filter 212, before being output to a switching converter 216.

The switching converter 216 may comprise an input switch 220, a transformer 224, an output rectifier 228, and an output filter 232. The input switch 220 may modulate current and voltage provided to downstream circuitry, such as the transformer 224, the output rectifier 228, the output filter 232, and any other components included in the power supply system 200 or that receive power from the power supply system 200. The input switch 220 may be configured to protect these components by switching off power to the downstream circuitry if the current or voltage are higher than one or more predetermined values. The input switch 220 may also be configured to switch off if a short circuit or another fault occurs.

In some examples, the input switch 220 may be switched on and off continuously to provide power to the transformer 224. The transformer 224 may be configured to transform the power into low-voltage AC that will be converted to DC by output rectifier 228. In the example described above, the switching converter 216 may receive 380V DC, which the transformer 224 may reduce to under 380V. For example, the transformer 224 may be configured to output 15V DC (output of rectifier 228) or other suitable voltage.

The transformer 224 may be configured to output power to the output rectifier 228. The switching converter 216 may work together with the rectifier 208 to perform the power conversion. The output rectifier 228 may also be provided with output filter 232, which may smooth the DC output voltage before it is output from the switching converter 216. The output filter 232 may also be configured to provide bulk energy storage.

In some examples, the switching converter 216 may be integrated with one or more output switches 236. The one or more output switches 236 may be configured to manage the DC power, and may additionally or alternatively include one or more leads, terminals, pads, contacts or other suitable means for input/output of power and signals. For example, the output switches 236 may comprise an output lead 240, a signal lead 244 and a ground lead 248, which may be wired to or otherwise connect with a power contact, a signal contact, and a ground contact, respectively, of a power supply device, such as the power supply device 100 illustrated by example in FIG. 1.

In some examples, the output lead 240 may be configured to output the low voltage DC power to another device. The ground lead 248 may serve as a return lead to form a circuit with the other device. In some examples, the output lead 240 may be positively-charged and the ground lead 248 may be negatively-charged. It will also be appreciated that the output lead 240 and the ground lead 248 may be interchangeable.

In the following example, the output lead 240 and the ground lead 248 may contact an object and form a circuit, with the object serving as a load on the circuit. The power supply system 200 may determine that the load is connected to the output lead 240 and the ground lead 248. The power supply system 200 may implement any suitable methods and/or devices to detect the presence of the load. For example, the power supply system 200 may comprise power control logic 234 configured to monitor one or more of a voltage or a current between the output lead 240 and the ground lead 248.

For example, the power supply system 200 may be configured to generate a 15V potential between the output lead 240 and the ground lead 248. The voltage may drop during standby (before full power is provided to the load) when a load is connected. If the voltage drops more than a threshold amount, the power supply system 200 may be configured to determine that the load is connected. In some examples, the threshold amount may be in a range of a voltage drop of approximately 1.08V to approximately 3V.

The power control logic 234 may be configured to determine whether a load is connected to the power supply system, along with performing other methods and processes described herein. With reference again to FIG. 2, the power control logic 234 may include a monitor circuit 260, a switching circuit 264, and a feedback system 268. The monitor circuit 260 may be configured to receive a signal 272 from the signal lead 244 of the output switches 236 to detect when the power supply system 200 is connected to a device. In some examples, the monitor circuit 260 is configured to receive an enable signal from a connected device that signifies the device is connected to the power supply and available to receive power.

For example, a compatible tablet computing device may receive DC power from the power supply system 200 and determine that it is connected to a power supply. The tablet computing device may then send an enable signal to the power supply via signal lead 244. The enable signal may indicate that the device is ready to accept the full DC power continuously and/or at a full voltage corresponding to the requirements of the device.

The monitor circuit 260 may additionally or alternatively be configured to monitor a voltage and/or a current 276 from the output switches 236. By monitoring the current and/or voltage output by the output switches 236, the monitor circuit 260 may detect faults and regulate the power supply system 200 accordingly. For example, the monitor circuit 260 may be configured to protect the power supply system 200 from overcurrent, overvoltage, or short circuit conditions. The monitor circuit 260 may also output an output switch control signal 280 configured to control the output switches 236 to activate or deactivate the full DC power, or to provide the DC power via a resistor 256 as described in more detail below.

The switching circuit 264 may receive inputs from the monitor circuit 260, the feedback system 268 and/or the output switches 236. For example, the feedback system 268 may comprise one or more amplifiers configured to provide the voltage and/or the current to the switching circuit 264. The feedback system 268 may also compare the voltage and/or the current to an internal reference and create an error signal. The switching circuit 264 may use the error signal, voltage, current, and/or other outputs from the feedback system 268 and the monitor circuit 260 to generate a switch control signal 284. The switch control signal 284 may be provided to the switching converter 216 to regulate the switching converter 216. For example, the switching circuit 264 may be configured to cut off power to the switching converter 216, via the input switch 220, if a fault is detected.

As noted above, in some examples a restricted power mode may be utilized to reduce or eliminate electromigration via objects touching the exposed contacts of the power supply system 200. In some examples and as described in more detail below, when AC power is initially applied to the power supply system 200, the power control logic 234 may be configured to enter a standby mode to check for a load attachment and look for an enable signal from a connected device. Where a load is detected and an enable signal is not received, the power control logic 234 may be configured to selectively implement the restricted power mode.

As described above, the power control logic 234 may be configured to determine that a load is connected to the power supply system 200. In some examples, the load may be a device connected to the power supply device, such as a tablet computing device, to receive the DC power for operation or to charge a battery. Based on receiving the DC power, the device may be configured to output an enable signal to the power supply device via the signal lead 244. As discussed above, the enable signal may indicate that the device is connected, and that it may be ready to enter a full power mode. For example, the full power mode may comprise providing continuous full DC power to the device.

In one example and as described in more detail below, based on determining that a load is connected, the power supply system 200 may provide the DC power at a first voltage in a standby mode until determining that a standby time period has elapsed. The first voltage may be the voltage of the low-voltage DC power provided by the switching converter 216. For example, the first voltage may be 15V or any other suitable voltage. In some examples, the first voltage is the "full" voltage utilized to power a connected device.

The standby time period of the standby mode may be any suitable time period, such as 2.5 seconds, 3.0 seconds, or other suitable time period, and may comprise a predetermined number of pulses of DC power. Where the standby time period elapses and an enable signal is not received from a connected device, the system then may enter the restricted power mode. As described in more detail below, in different examples the restricted power mode comprises either selectively providing the DC power at a lower voltage or deactivating the DC power.

In some examples of a standby mode, providing the DC power at the first voltage until a standby time period elapses comprises pulsing the DC power for a predetermined number of consecutive pulses that are each separated by a pause time period. Pulsing the DC power may comprise providing the DC power in cycles, wherein the DC power may be activated and deactivated for one or more predetermined time periods. In the example of FIG. 2, the DC power may be activated and deactivated by one or more of the output switches 236. In some examples, the one or more output switches 236 may include a dedicated switch 252 configured to switch the DC power on or off at the one or more predetermined time periods.

Figure 3:
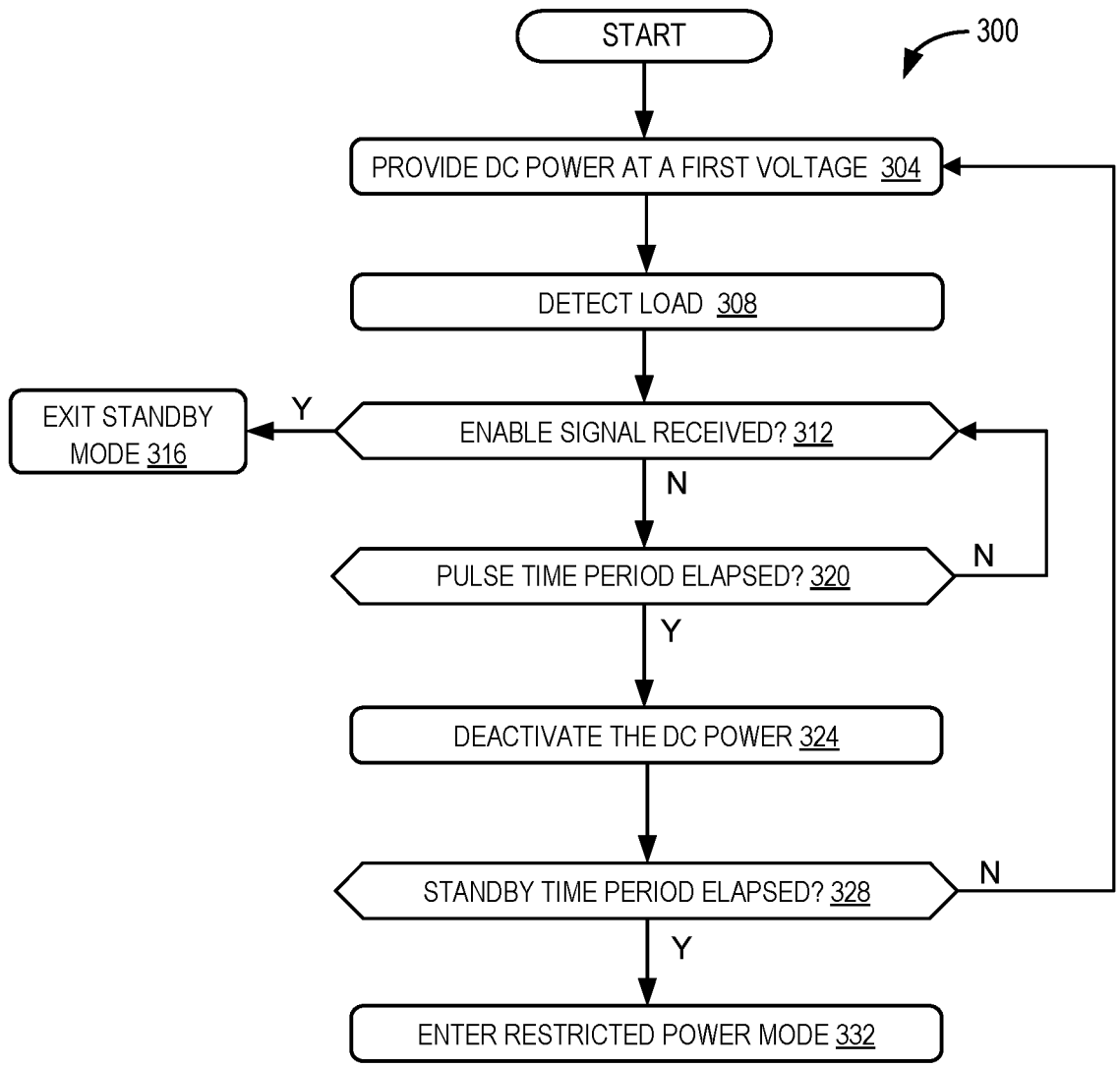
FIG. 3 is a block diagram of a method for providing DC power at a first voltage according to examples of the present disclosure.

With reference now to FIG. 3, an example of a standby mode that includes pulsing DC power at a full voltage is provided. In some examples, the method 300 may be implemented by the power control logic 234 and/or the one or more output switches 236 of the power supply system 200. As illustrated in FIG. 3, at 304, the method 300 may include providing DC power at a first voltage. In some examples, the first voltage may be the full voltage required by a connected device, such as 15 V. At 308 the method 300 may include detecting a load on the power supply system. For example, a load may be detected by monitoring the output voltage of the power supply system as described above.

At 312, the method 300 may include determining whether an enable signal is received via the signal lead 244. If an enable signal is received from a connected device, then at 316 the system exits the standby mode and provides continuous DC power to the connected device. If an enable signal is not received, then at 320 the method 300 determines whether a pulse time period has elapsed. The pulse time period corresponds to the duration of one pulse of DC power. In one example, a pulse time period of 100 milliseconds (ms) may be utilized. In other examples, 50 ms, 150 ms, 200 ms, or other pulse time periods may be utilized. If the pulse time period has not elapsed, then the method loops to 312 to continue looking for an enable signal. If the pulse time period has elapsed, then at 324 the method 300 includes deactivating the DC power.

With the DC power deactivated, at 328, the method 300 may include determining if the standby time period has elapsed. As illustrated in FIG. 3, until determining that the standby time period has elapsed, the method 300 may include repeating steps 304 through 328 and providing pulses of DC power. In this manner, and in one potential advantage of the present disclosure, providing the DC power in discrete pulses for a limited standby time period reduces the electrical field through the object connected to the circuit, which in turn may reduce electromigration through the object. Accordingly, whenever an object other than a connected device accidentally touches the power supply system's exposed contacts, the duration of full voltage on the output contacts is limited to no longer than the standby time period.

In some examples, the standby time period includes a pause time period during which the DC power is deactivated. In one example the pause time period may be 500 ms. In this example, and where the pulse time period is 100 ms for example, the system turns on full voltage to the output lead for 100 ms and then turns off the voltage for 500 ms. It will be appreciated that in other examples, other pause time periods of different durations may be utilized.

As noted above, these pulses of DC power may be repeated until the standby time period has elapsed or an enable signal is received from a connected device. In one example, the standby time period may be defined by a predetermined number of pulses or cycles of DC power. For example, where the system turns on full voltage for 100 ms and turns off the voltage for 500 ms, the standby time period may be defined as 5 consecutive pulses. In other examples, the standby time period may be defined as any suitable number of consecutive pulses or other temporal duration. It will also be appreciated that in various examples, the duration of the standby time period, pulse time period, and/or pause time period may be adjusted to particular use case requirements.

Returning to FIG. 3, and based on determining that the standby time period has elapsed at 328, at 332 the method 300 then enters a restricted power mode. As described in more detail below, in different examples of the restricted power mode the power supply device may provide pulses of limited output voltage until determining that the load is no longer connected to the power supply device, or the power supply device may de-energize power to the output lead.

It will be appreciated that the method 300 described above is provided by way of example and is not meant to be limiting. Therefore, it is to be understood that method 300 may include additional and/or alternative steps relative to those illustrated in FIG. 3. Further, it is to be understood that method 300 may be performed in any suitable order. Further still, it is to be understood that one or more steps may be omitted from method 300 without departing from the scope of this disclosure.

Figure 4:
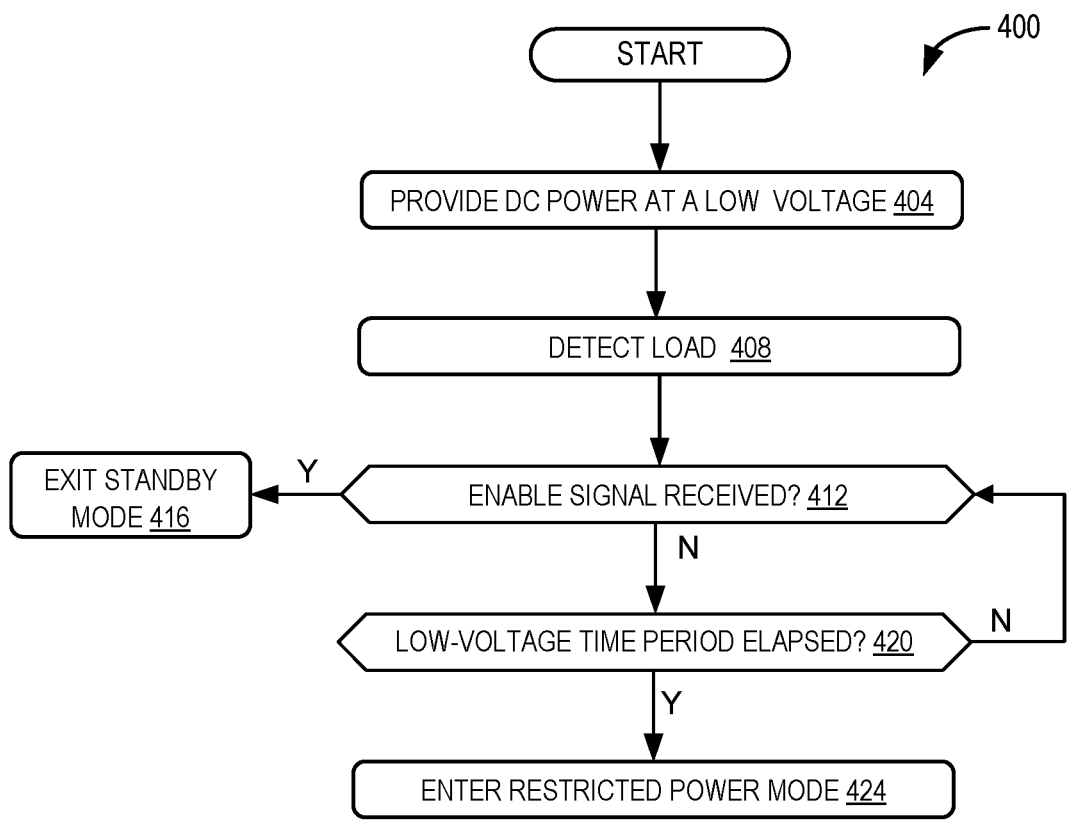
FIG. 4 is a block diagram of another method for providing DC power according to examples of the present disclosure.

With reference now to FIG. 4, another example method 400 is illustrated for managing DC power. In this example, instead of pulsing the DC power in a standby mode prior to entering the restricted power mode, continuous DC power at a lower voltage is provided in a low-voltage mode prior to entering the restricted power mode. In some examples, the method 400 may be implemented by the power control logic 234 and/or the one or more output switches 236 of the power supply system 200.

As illustrated in FIG. 4, at 404, the method 400 may include providing the continuous DC power at a low voltage. The low voltage may comprise a voltage lower that a full voltage normally provided to a connected device. In different examples, the low voltage may comprise 3.3 V, 5 V, or any other suitable voltage. At 408 the method 400 may include detecting a load on the circuit.

At 412, the method 400 may include determining whether an enable signal is received. If an enable signal is received from a connected device, then at 416 the system exits the standby mode and provides continuous DC power to the connected device. If an enable signal is not received, then at 420 the method 400 determines whether a low-voltage time period has elapsed. In one example, a low-voltage time period of 2.5 secs may be utilized. In other examples, 2.0 secs, 3.0 secs, 4.0 secs or other low-voltage time periods may be utilized. If the low-voltage time period has not elapsed, then the method loops to 412 to continue looking for an enable signal. If the low-voltage time period has elapsed, then at 424 the method 400 enters a restricted power mode as described in more detail below.

It will be appreciated that the method 400 described above is provided by way of example and is not meant to be limiting. Therefore, it is to be understood that method 400 may include additional and/or alternative steps relative to those illustrated in FIG. 4. Further, it is to be understood that method 400 may be performed in any suitable order. Further still, it is to be understood that one or more steps may be omitted from method 400 without departing from the scope of this disclosure.

Examples of restricted power modes will now be described. As described in more detail below, in the restricted power mode the power supply system reduces or eliminates the DC power provided to the output lead of the system until either the circuit does not detect any load on the output lead for a predetermined number of pulses (where DC power has been reduced) or the AC power is recycled (where DC power has been deactivated). When the AC power is recycled or no load is detected for the predetermined number of pulses, the output circuit may return to the standby mode described above.

In one example, the restricted power mode may comprise deactivating the DC power upon entering the restricted power mode. In this manner, electromigration to the object contacting the exposed leads is prevented. In some examples, after deactivating the DC power, the power supply may reenter the standby mode when the AC input is re-cycled (e.g., the plug is removed and reinserted into a power socket).

Figure 5:
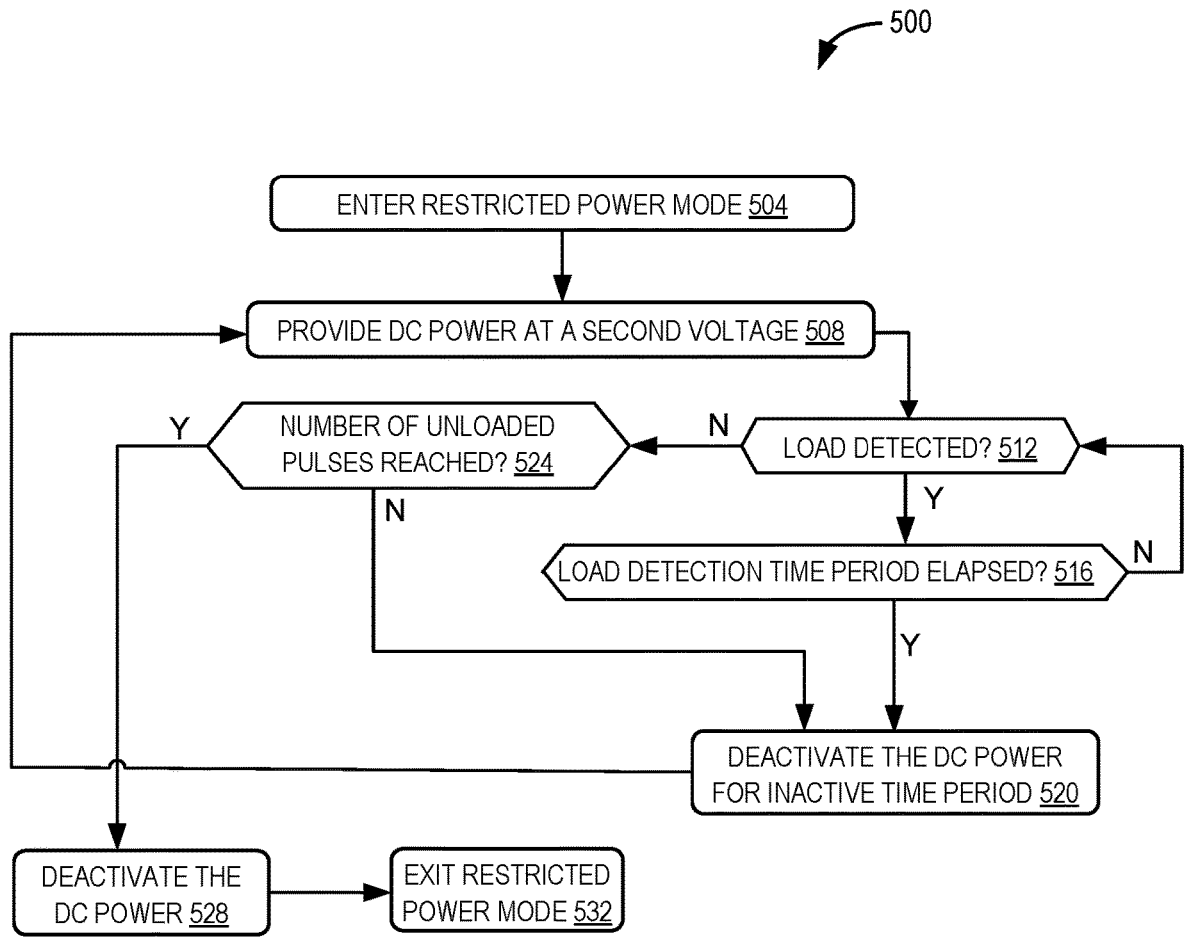
FIG. 5 is a block diagram of a method for managing DC power utilizing a restricted power mode according to examples of the present disclosure.

With reference now to FIG. 5, another example method 500 of managing the DC power utilizing a restricted power mode is provided. As described in more detail below, in this example the restricted power mode includes pulsing DC power at a second voltage that may be less than or equal to the first voltage of the standby mode. In one example, at 504 the method 500 includes entering the restricted power mode from the standby mode described above. At 508 the method 500 may include providing the DC power at a second voltage. In different examples the second voltage may be less than or equal to the first voltage. For example, where the second voltage is less than the first voltage, the first voltage may be reduced the second voltage by routing the DC power through one or more resistors, such as the resistor 256 of FIG. 2. In one example, resistor 256 may have a resistance of 10 kΩ. It will be appreciated that in different examples one or more resistors having any suitable resistance may be utilized. In some examples, the first voltage may be 15 V and the second voltage may be 3.3V or 5V.

In some examples, providing the DC power at the second voltage comprises pulsing the DC power until no load is detected on the output lead for a predetermined number of pulses (e.g., unloaded pulses). For example and returning to FIG. 5, at 512 the method 500 may include determining whether a load detected on the circuit. If a load is detected on the circuit, then at 516 the method may continue providing DC power until a load detection time period has lapsed. The load detection time period may define the duration of each pulse of DC power in the restricted power mode. The load detection time period may be any suitable time period, such as 10 ms. In some examples, the duration of the load detection time period may be selected to provide the DC power for a timeframe long enough to enable the power control logic to monitor the output voltage at the output contact, and thereby determine if the load remains connected to the power supply system. Additionally, and in one potential advantage of the present disclosure, by setting the load detection time period at a relatively short duration, such as 10 ms, electromigration through the object touching the exposed contacts is substantially minimized.

Returning to FIG. 5 and the case where a load is detected, when the load detection time period elapses at 516, at 520 the method 500 includes deactivating the DC power for an inactive time period. In different examples, the inactive time period may be 2 seconds, 3 secs, 4 secs or other suitable duration during which the DC power is deactivated. In this manner, and when combined with the short load detection time period during which DC power is pulsed, the object contacting the power supply leads may be exposed to DC power for a small fraction, such as 0.3%, of an overall amount of time spent in the restricted power mode. After the inactive time period has elapsed at 520, the method 500 returns to 508 to provide DC power to the output lead at the second voltage.

Returning to step 512, at some point the load on the circuit may be removed. For example, where a person's finger has been touching the exposed contacts, the person may remove her finger from the contacts. Accordingly and at 512, where a load is not detected on the circuit (e.g., an unloaded pulse), then the method 500 may determine whether the load is still connected to the power supply. For example, although one unloaded pulse may be detected, in some cases the object touching the contacts may momentarily separate from and then reengage the contacts. Accordingly and in one example at 524, determining whether the load is still connected to the power supply may comprise determining whether a predetermined number of consecutive unloaded pulses have been detected. In one example the predetermined number of consecutive unloaded pulses may be 2. In other examples the predetermined number may be 3, 4 or any suitable number.

At 524, where the method 500 determines that the predetermined number of consecutive unloaded pulses has not been reached, the method proceeds to 520 where the DC power is deactivated for the inactive time period. After the inactive time period elapses, at 508 the DC power is again pulsed at the second voltage as described above.

Returning to 524, where the method 500 determines that the predetermined number of consecutive unloaded pulses has been reached, the method proceeds to deactivate the DC power at 528 and to exit the restricted power mode at 532. In some examples, upon exiting the restricted power mode the system may return to the standby mode as described above.

It will be appreciated that method 500 is provided by way of example and is not meant to be limiting. Therefore, it is to be understood that method 500 may include additional and/or alternative steps relative to those illustrated in FIG. 5. Further, it is to be understood that method 500 may be performed in any suitable order. Further still, it is to be understood that one or more steps may be omitted from method 500 without departing from the scope of this disclosure.

Figure 6A:
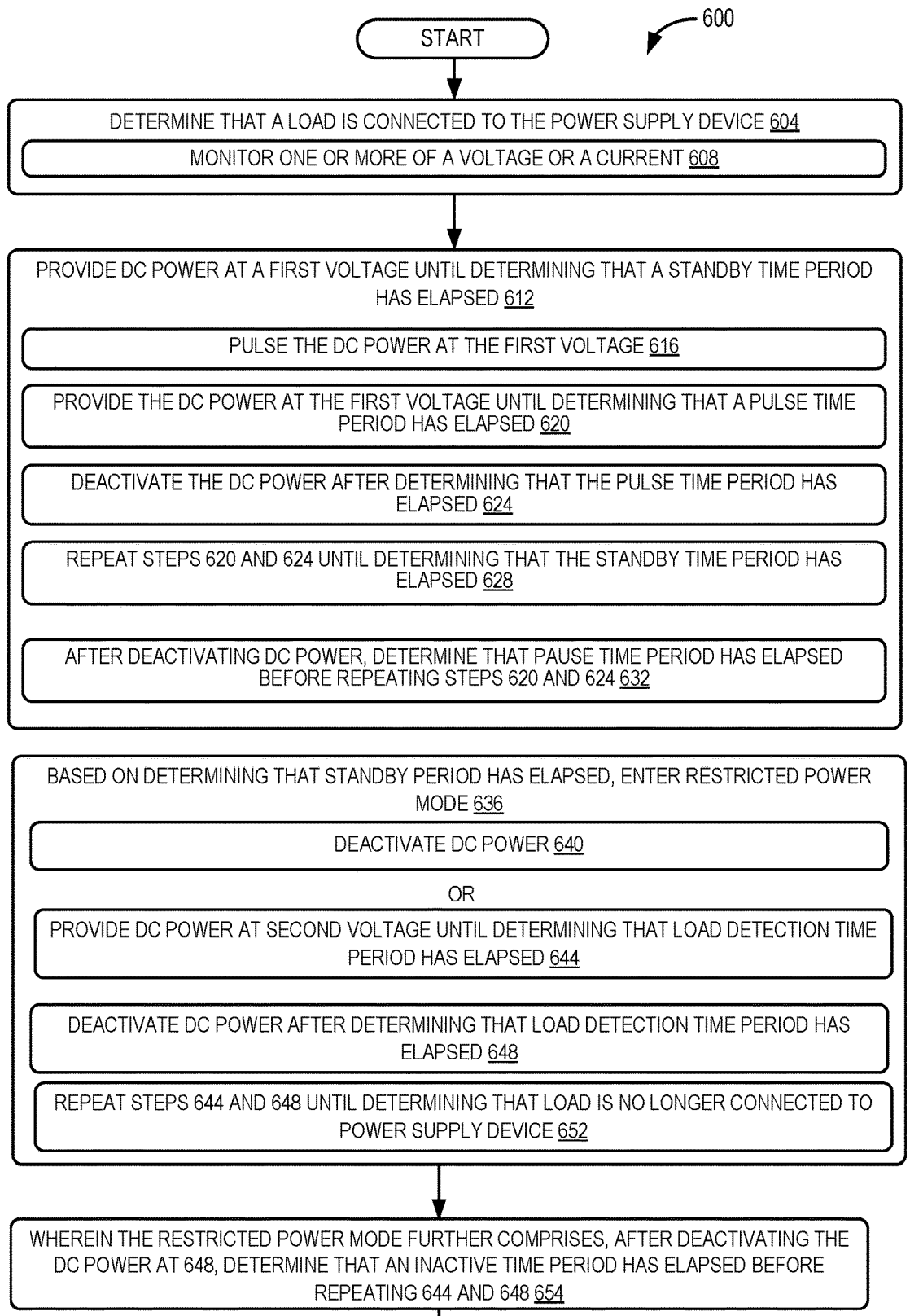
FIGS. 6A-6B illustrate another method for managing DC power according to examples of the present disclosure.
Figure 6B:
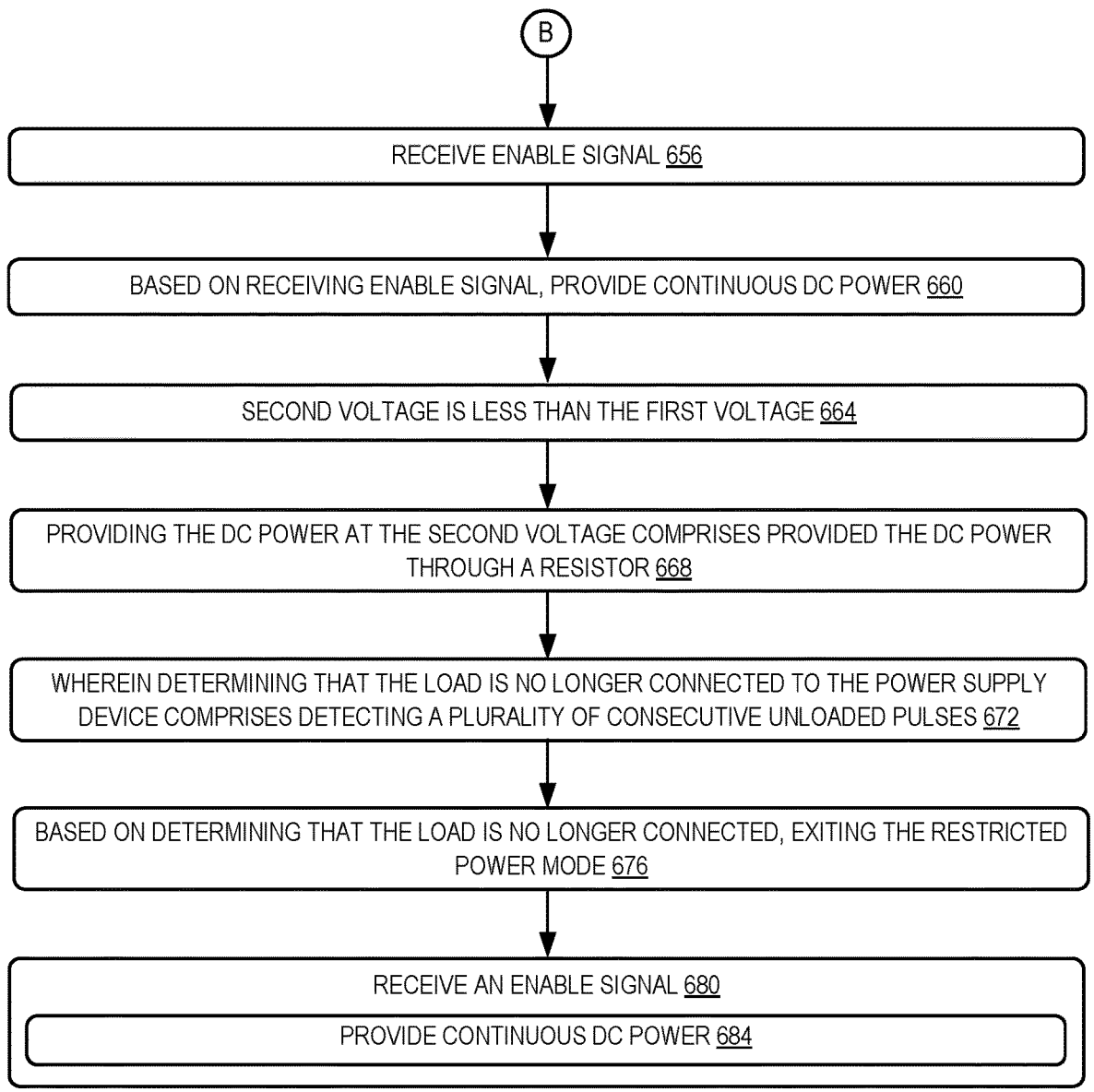

FIGS. 6A and 6B illustrate another example of a method 600 for managing DC power according to examples of the present disclosure. In some examples method 600 may be performed by power supply system 200. The following description of method 600 is provided with reference to the components described herein and shown in FIGS. 1-5. It will be appreciated that method 600 also may be performed in other contexts using other suitable components.

With reference to FIG. 6A, at 604 the method 600 may include determining that a load is connected to the power supply device. At 608, the method 600 may include, wherein determining that the load is connected to the power supply device comprises monitoring one or more of a voltage or a current. At 612, the method 600 may include providing DC power at a first voltage until determining that a standby time period has elapsed. At 616, the method 600 may include, wherein providing the DC power at the first voltage comprises pulsing the DC power at the first voltage.

At 620, the method 600 may include, wherein providing the DC power at the first voltage until determining that the standby time period has elapsed comprises providing the DC power at the first voltage until determining that a pulse time period has elapsed. At 624, the method 600 may include deactivating the DC power after determining that the pulse time period has elapsed. At 628, the method 600 may include repeating steps 620 and 624 until determining that the standby time period has elapsed. At 632, the method 600 may include, after deactivating the DC power, determining that a pause time period has elapsed before repeating steps 620 and 624.

At 636, the method 600 may include, based on determining that the standby time period has elapsed, entering a restricted power mode, wherein the restricted power mode comprises either, at 640, deactivating the DC power; or at 644, providing the DC power at a second voltage until determining that a load detection time period has elapsed, at 648 deactivating the DC power after determining that the load detection time period has elapsed, and at 652 repeating steps 644 and 648 until determining that the load is no longer connected to the power supply device. At 654 the method 600 may include, wherein the restricted power mode further comprises, after deactivating the DC power after determining that the load detection time period has elapsed at 648, determining that an inactive time period has elapsed before repeating steps 644 and 648.

With reference now to FIG. 6B, at 656 the method 600 may include receiving an enable signal. At 660 the method 600 may include, based on receiving the enable signal, providing continuous DC power via the power supply device. At 664 the method 600 may include, wherein the second voltage is less than the first voltage. At 668 the method 600 may include, wherein providing the DC power at the second voltage comprises providing the DC power through a resistor.

At 672, the method 600 may include, wherein determining that the load is no longer connected to the power supply device comprises detecting a plurality of consecutive unloaded pulses. At 676, the method 600 may include, based on determining that the load is no longer connected to the power supply device, exiting the restricted power mode. At 680, the method 600 may include receiving an enable signal. At 684, the method 600 may include, based on receiving the enable signal, providing continuous DC power.

It will be appreciated that method 600 is provided by way of example and is not meant to be limiting. Therefore, it is to be understood that method 600 may include additional and/or alternative steps relative to those illustrated in FIGS. 6A and 6B. Further, it is to be understood that method 600 may be performed in any suitable order. Further still, it is to be understood that one or more steps may be omitted from method 600 without departing from the scope of this disclosure.

In some embodiments, the methods and processes described herein may be tied to a computing system of one or more computing devices. In particular, such methods and processes may be implemented in hardware as described above, as a computer-application program or service, an application-programming interface (API), a library, and/or other computer-program product.

Figure 7:
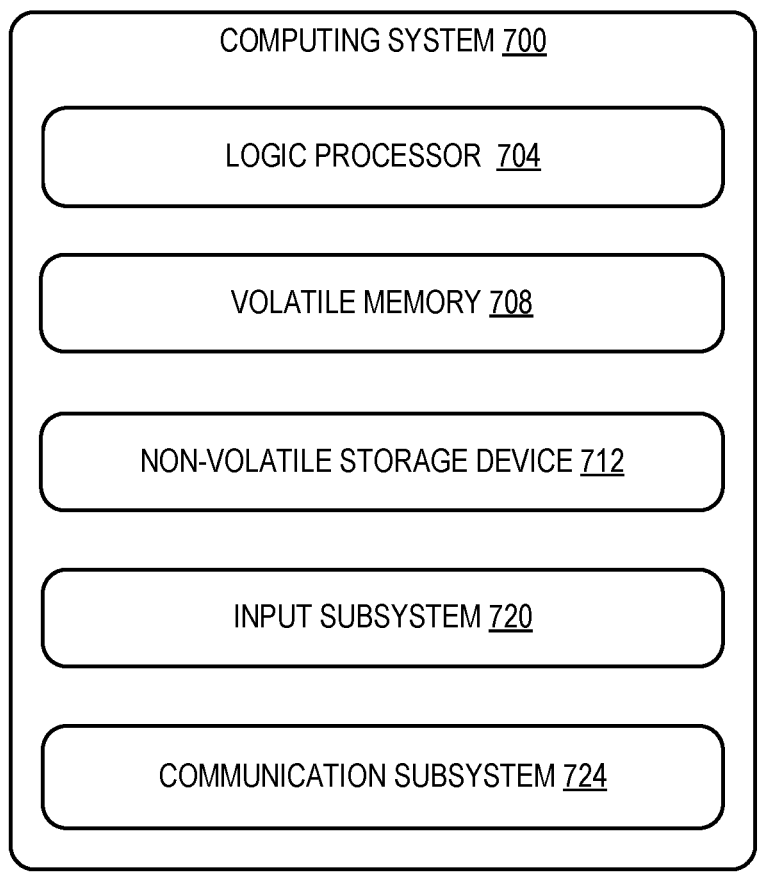
FIG. 7 shows a block diagram of an example computing device according to examples of the present disclosure.

FIG. 7 schematically shows a non-limiting embodiment of a computing system 700 that can enact one or more of the methods and processes described above. Computing system 700 is shown in simplified form. Computing system 700 may take the form of one or more single-board computers, personal computers, server computers, tablet computers, home-entertainment computers, network computing devices, gaming devices, mobile computing devices, mobile communication devices (e.g., smart phones), and/or other computing devices. In the example of FIG. 2, one or more aspects of the power control logic 234 may comprise computing system 700 or one or more aspects of computing system 700.

Computing system 700 includes a logic processor 704, volatile memory 708, and a non-volatile storage device 712.

Computing system 700 may optionally include an input subsystem 720, communication subsystem 724 and/or other components not shown in FIG. 7.

Logic processor 704 includes one or more physical devices configured to execute instructions. For example, the logic processor may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic processor 704 may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 704 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 712 includes one or more physical devices configured to hold instructions executable by the logic processors to implement the methods and processes described herein. When such methods and processes are implemented, the state of non-volatile storage device 712 may be transformed—e.g., to hold different data.

Non-volatile storage device 712 may include physical devices that are removable and/or built-in. Non-volatile storage device 712 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 712 may include nonvolatile, dynamic, static, read/write, read-only, sequential-access, location-addressable, file-addressable, and/or content-addressable devices. It will be appreciated that non-volatile storage device 712 is configured to hold instructions even when power is cut to the non-volatile storage device 712.

Volatile memory 708 may include physical devices that include random access memory. Volatile memory 708 is typically utilized by logic processor 704 to temporarily store information during processing of software instructions. It will be appreciated that volatile memory 708 typically does not continue to store instructions when power is cut to the volatile memory 708.

Aspects of logic processor 704, volatile memory 708, and non-volatile storage device 712 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "program" and "application" may be used to describe an aspect of computing system 700 typically implemented in software by a processor to perform a particular function using portions of volatile memory, which function involves transformative processing that specially configures the processor to perform the function. Thus, a program or application may be instantiated via logic processor 704 executing instructions held by non-volatile storage device 712, using portions of volatile memory 708. It will be understood that different programs and/or applications may be instantiated from the same application, service, code block, object, library, routine, API, function, etc. Likewise, the same program and/or application may be instantiated by different applications, services, code blocks, objects, routines, APIs, functions, etc. The terms "program" and "application" may encompass individual or groups of executable files, data files, libraries, drivers, scripts, database records, etc.

It will be appreciated that a "service", as used herein, is an application program executable across multiple user sessions. A service may be available to one or more system components, programs, and/or other services. In some implementations, a service may run on one or more server-computing devices.

When included, input subsystem 720 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 724 may be configured to communicatively couple various computing devices described herein with each other, and with other devices. Communication subsystem 724 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow computing system 700 to send and/or receive messages to and/or from other devices via a network such as the Internet.

The following paragraphs provide additional support for the claims of the subject application. One aspect provides, at a power supply device a method for managing DC power, the method comprising: providing DC power at a first voltage until determining that a standby time period has elapsed; determining that a load is connected to the power supply device; and based on determining that the standby time period has elapsed, entering a restricted power mode, wherein the restricted power mode comprises either: deactivating the DC power, or (1) providing the DC power at a second voltage until determining that a load detection time period has elapsed, (2) deactivating the DC power after determining that the load detection time period has elapsed, and (3) repeating (1) and (2) until determining that the load is no longer connected to the power supply device. The method may additionally or alternatively include, wherein determining that the load is connected to the power supply device comprises monitoring one or more of a voltage or a current. The method may additionally or alternatively include receiving an enable signal; and based on receiving the enable signal, providing continuous DC power. The method may additionally or alternatively include, wherein providing the DC power at the first voltage comprises pulsing the DC power at the first voltage.

The method may additionally or alternatively include, wherein providing the DC power at the first voltage until determining that the standby time period has elapsed comprises: (a) providing the DC power at the first voltage until determining that a pulse time period has elapsed; (b) deactivating the DC power after determining that the pulse time period has elapsed; and (c) repeating (a) and (b) until determining that the standby time period has elapsed. The method may additionally or alternatively include, after (b) deactivating the DC power, determining that a pause time period has elapsed before repeating (a) and (b).

The method may additionally or alternatively include, wherein the second voltage is less than the first voltage. The method may additionally or alternatively include, wherein providing the DC power at the second voltage comprises providing the DC power through a resistor. The method may additionally or alternatively include, based on determining that the load is no longer connected to the power supply device, exiting the restricted power mode. The method may additionally or alternatively include, wherein determining that the load is no longer connected to the power supply device comprises detecting a plurality of consecutive unloaded pulses. The method may additionally or alternatively include, wherein the restricted power mode further comprises, after (2) deactivating the DC power after determining that the load detection time period has elapsed, determining that an inactive time period has elapsed before repeating (1) and (2).

Another aspect provides a power supply device, comprising: a power lead; a ground lead; and power control logic configured to: provide DC power at a first voltage until determining that a standby time period has elapsed, determine that a load is connected to the power lead and the ground lead, and based on determining that the standby time period has elapsed, either: deactivate the DC power, or (1) provide the DC power at a second voltage until determining that a load detection time period has elapsed, (2) deactivate the DC power after determining that the load detection time period has elapsed, and (3) repeat (1) and (2) until determining that the load is no longer connected to the power supply device. The power supply device may additionally or alternatively include, wherein the power control logic is further configured to receive an enable signal, and based on receiving the enable signal, provide continuous DC power. The power supply device may additionally or alternatively include, wherein providing the DC power at the first voltage comprises pulsing the DC power at the first voltage.

The power supply device may additionally or alternatively include, wherein the power control logic is further configured to (a) provide the DC power at the first voltage until determining that a pulse time period has elapsed, (b) deactivate the DC power after determining that the pulse time period has elapsed, and (c) repeat (a) and (b) until determining that the standby time period has elapsed. The power supply device may additionally or alternatively include, wherein the power control logic is further configured to determine that a pause time period has elapsed before repeating (a) and (b).

The power supply device may additionally or alternatively include, wherein providing the DC power at the second voltage comprises providing the DC power through a resistor. The power supply device may additionally or alternatively include, wherein the power control logic is further configured to determine that the load is no longer connected to the power supply device by detecting a plurality of consecutive unloaded pulses. The power supply device may additionally or alternatively include, wherein the power control logic is further configured to determine that an inactive time period has elapsed before repeating (1) and (2).

Another aspect provides, at a power supply device, a method for managing DC power, the method comprising: providing DC power at a first voltage until determining that a standby time period has elapsed, determining that a load is connected to the power supply device, based on determining that the standby time period has elapsed, entering a restricted power mode, wherein the restricted power mode comprises either: deactivating the DC power, or (1) providing the DC power at a second voltage until determining that a pulse time period has elapsed, (2) deactivating the DC power after determining that the pulse time period has elapsed, (3) determining that a pause time period has elapsed, and (4) repeat (1), (2), and (3) until determining that the load is no longer connected to the power supply device; receiving an enable signal; and based on receiving the enable signal, providing continuous DC power.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. At a power supply device, a method for managing DC power, the method comprising:
   providing DC power at a first voltage until determining that a standby time period has elapsed;
   determining that a load is connected to the power supply device;
   on condition of (1) determining that the standby time period has elapsed, and (2) determining that the load is connected to the power supply device, entering a restricted power mode, wherein the restricted power mode comprises:
   (1) providing the DC power at a second voltage until determining that a load detection time period has elapsed,
   (2) deactivating the DC power after determining that the load detection time period has elapsed, and
   (3) repeating (1) and (2) until determining that the load is no longer connected to the power supply device, wherein the determination that the load is no longer connected to the power supply device is made on condition of detecting a plurality of consecutive unloaded pulses during (1); and as a result of entering the restricted power mode, reducing current provided through the connected load.

2. The method of claim 1, wherein determining that the load is connected to the power supply device comprises monitoring one or more of a voltage or a current.

3. The method of claim 1, further comprising:
receiving an enable signal output by an optionally connected external computing device in response to receiving the DC power; and
based on receiving the enable signal, providing continuous DC power.

4. The method of claim 1, wherein providing the DC power at the first voltage comprises pulsing the DC power at the first voltage.

5. The method of claim 1, wherein providing the DC power at the first voltage until determining that the standby time period has elapsed comprises:
(a) providing the DC power at the first voltage until determining that a pulse time period has elapsed;
(b) deactivating the DC power after determining that the pulse time period has elapsed; and
(c) repeating (a) and (b) until determining that the standby time period has elapsed.

6. The method of claim 5, further comprising, after (b) deactivating the DC power, determining that a pause time period has elapsed before repeating (a) and (b).

7. The method of claim 1, wherein the second voltage is less than the first voltage.

8. The method of claim 1, wherein providing the DC power at the second voltage comprises providing the DC power through a resistor.

9. The method of claim 1, further comprising, based on determining that the load is no longer connected to the power supply device, exiting the restricted power mode.

10. The method of claim 1, wherein the restricted power mode further comprises, after (2) deactivating the DC power after determining that the load detection time period has elapsed, determining that an inactive time period has elapsed before repeating (1) and (2).

11. The method of claim 3, wherein the enable signal indicates that the external computing device is ready to accept the DC power continuously and/or at a full voltage corresponding to requirements of the external computing device.

12. A power supply device, comprising:
a power lead;
a ground lead;
a signal lead; and
power control logic configured to:
provide DC power at a first voltage until determining that a standby time period has elapsed,
determine that a load is connected to the power lead and the ground lead,
on condition of (1) determining that the standby time period has elapsed, and (2) determining that the load is connected to the power lead and the ground lead:
(1) provide the DC power at a second voltage until determining that a load detection time period has elapsed,
(2) deactivate the DC power after determining that the load detection time period has elapsed, and
(3) repeat (1) and (2) until determining that the load is no longer connected to the power supply device, wherein the determination that the load is no longer connected to the power supply device is made on condition of detecting a plurality of consecutive unloaded pulses during (1); and
as a result of (1) providing the DC power at the second voltage until determining that the load detection time period has elapsed, (2) deactivating the DC power after determining that the load detection time period has elapsed, and (3) repeating (1) and (2) until determining that the load is no longer connected to the power supply device, reduce current provided through the connected load.

13. The power supply device of claim 12, wherein the power control logic is further configured to receive an enable signal output by an optionally connected external computing device in response to receiving the DC power, and based on receiving the enable signal, provide continuous DC power.

14. The power supply device of claim 12, wherein providing the DC power at the first voltage comprises pulsing the DC power at the first voltage.

15. The power supply device of claim 12, wherein the power control logic is further configured to (a) provide the DC power at the first voltage until determining that a pulse time period has elapsed, (b) deactivate the DC power after determining that the pulse time period has elapsed, and (c) repeat (a) and (b) until determining that the standby time period has elapsed.

16. The power supply device of claim 15, wherein the power control logic is further configured to determine that a pause time period has elapsed before repeating (a) and (b).

17. The power supply device of claim 12, wherein providing the DC power at the second voltage comprises providing the DC power through a resistor.

18. The power supply device of claim 12, wherein the power control logic is further configured to determine that an inactive time period has elapsed before repeating (1) and (2).

19. The power supply device of claim 13, wherein the enable signal indicates that the external computing device is ready to accept the DC power continuously and/or at a full voltage corresponding to requirements of the external computing device.

20. At a power supply device, a method for managing DC power, the method comprising:
providing DC power at a first voltage until determining that a standby time period has elapsed;
determining that a load is connected to the power supply device;
on condition of (1) determining that the standby time period has elapsed, and (2) determining that the load is connected to the power supply device, entering a restricted power mode, wherein the restricted power mode comprises:
(1) providing the DC power at a second voltage until determining that a pulse time period has elapsed,
(2) deactivating the DC power after determining that the pulse time period has elapsed,
(3) determining that a pause time period has elapsed, and
(4) repeat (1), (2), and (3) until determining that the load is no longer connected to the power supply device, wherein the determination that the load is no longer connected to the power supply device is made on condition of detecting a plurality of consecutive unloaded pulses during (1); and as a result of entering the restricted power mode, reducing current provided through the connected load.

\* \* \* \* \*